(12) United States Patent
Sanchez

(10) Patent No.: US 10,651,830 B1
(45) Date of Patent: May 12, 2020

(54) RECEIVER WITH CONFIGURABLE VOLTAGE MODE

(71) Applicant: NXP USA, INC., Austin, TX (US)

(72) Inventor: Hector Sanchez, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/509,799

(22) Filed: Jul. 12, 2019

(51) Int. Cl.
   *H03K 17/00* (2006.01)
   *H03K 3/037* (2006.01)
   *H04B 1/16* (2006.01)

(52) U.S. Cl.
   CPC .............. *H03K 3/037* (2013.01); *H04B 1/16* (2013.01)

(58) Field of Classification Search
   CPC ..... H03K 19/00315; H03K 19/018521; H03K 19/0013; H03K 19/00361; H03K 19/09441; H03K 19/0963; H03K 19/1737; H03K 19/0016; H03K 17/693; H03K 17/6872; H03K 17/505; H03K 17/04123; H04L 25/028; H04L 25/0272; H04L 25/0292; G05F 3/222; G05F 3/265; G05F 17/505
   See application file for complete search history.

(56) References Cited

U.S. PATENT DOCUMENTS

| | | | |
|---|---|---|---|
| 6,181,922 B1 * | 1/2001 | Iwai ...................... | H03H 11/245 455/249.1 |
| 9,356,577 B2 | 5/2016 | Sanchez et al. | |
| 9,503,090 B2 | 11/2016 | Fifield | |
| 2007/0290744 A1 * | 12/2007 | Adachi ..................... | H03F 3/24 330/51 |

OTHER PUBLICATIONS

U.S. Appl. No. 16/569,797, filed Sep. 13, 2019, entitled "High Voltage Tolerant Receiver".

* cited by examiner

*Primary Examiner* — Long Nguyen

(57) ABSTRACT

A receiver is provided. The receiver includes a first signal path and a second signal path coupled between an input terminal and an output terminal. A first transistor in the first signal path has a control electrode coupled to a voltage source terminal and a first current electrode coupled at the input terminal. The first transistor is configured and arranged for receiving a first signal at the first input terminal having a voltage exceeding a voltage rating of the first transistor. A second transistor in the first signal path has a first current electrode coupled to a second current electrode of the first transistor and a control electrode coupled to receive a first control signal. The second transistor is configured to form an open circuit in the first signal path when the first control signal is at a first state. A first resistor network in the second signal path is configured and arranged for attenuating the first signal.

20 Claims, 3 Drawing Sheets

RECEIVER WITH CONFIGURABLE VOLTAGE MODE

BACKGROUND

Field

This disclosure relates generally to electronic circuits, and more specifically, to a receiver circuit having configurable voltage modes of operation.

Related Art

Today, many modern electronic devices incorporate receiver circuitry for receiving input signals. Such receiver circuits are often required to receive extended voltage range input signals having maximum voltages extending beyond normal operating voltage ranges of the receiver circuits. However, receiver circuits may experience excessive leakage currents and induce signal distortion when receiving these extended voltage range input signals. It is thus desirable to provide a receiver circuit that accommodates a range of input signals while minimizing leakage current and signal distortion.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, an I/O receiver with high voltage tolerance and low signal distortion. The receiver includes a configurable signal path having a first signal path for receiving a low voltage input signal and a second path for receiving a high voltage input signal. The second signal path provides for low leakage currents with a resistor-based attenuator and an AC-coupled path portion for minimizing signal distortion. The receiver circuitry is implemented in a low-voltage process technology for accommodating both low voltage and high voltage signals.

Figure 1:
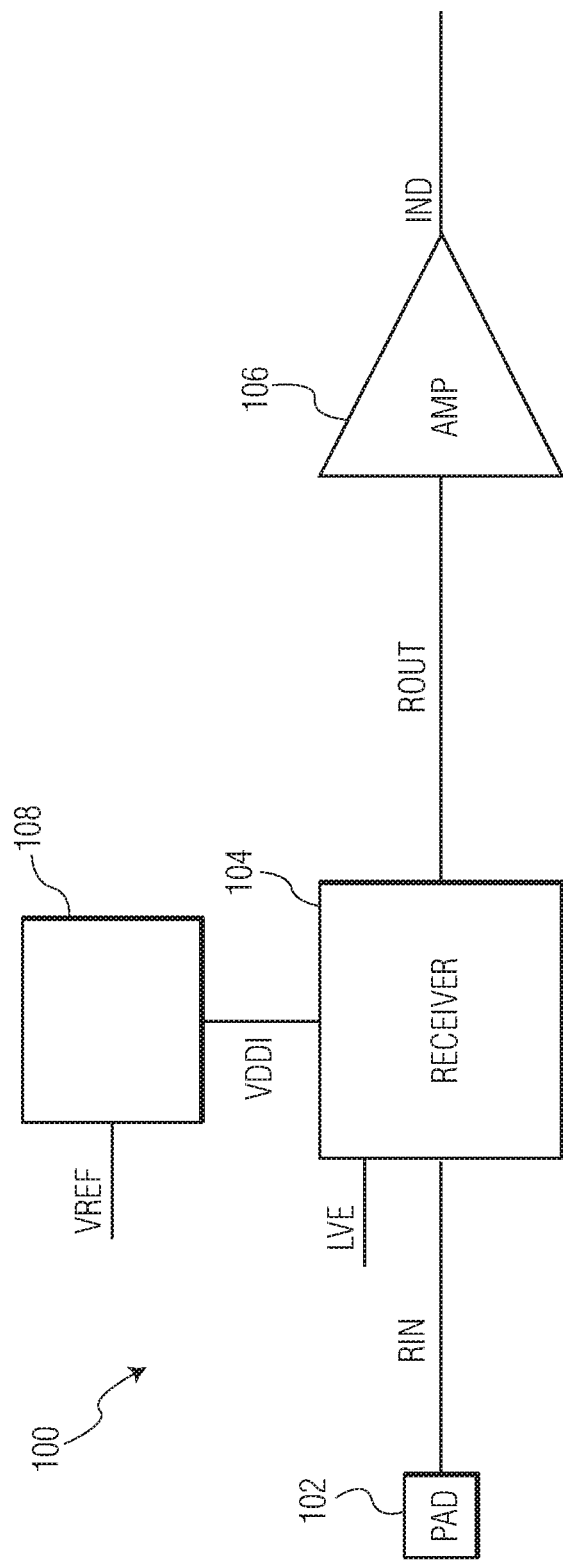
FIG. 1 illustrates, in simplified block diagram form, an example receiver in accordance with an embodiment.

FIG. 1 illustrates, in simplified block diagram form, an example receiver 100 in accordance with an embodiment. Receiver 100 is implemented as an integrated circuit and includes a bonding pad 102, a receiver block 104, an amplifier 106, and voltage source block 108. In this embodiment, an input signal RIN is received at an input terminal of the receiver block 104 by way of pad 102 and interconnecting signal line labeled RIN. An output signal ROUT is provided at an output terminal of the receiver block 104 to amplifier 106 by way of signal line labeled ROUT. For illustrative purposes, circuitry and features which may be commonly coupled at an I/O pad (e.g., bonding pad 102) such as electrostatic discharge (ESD) circuitry and output driver circuitry are not shown.

Receiver block 104 includes circuitry configured and arranged to receive input signals which have voltages exceeding a maximum operating voltage rating of transistors used to implement the receiver block 104 as well as input signals which are within the maximum operating voltage rating based on a control signal labeled LVE. The received input signals having voltages exceeding the maximum operating voltage rating are attenuated to be within the maximum operating voltage rating when provided as the output signal ROUT. The ROUT signal is provided to the amplifier 106 and the amplifier 106, in turn, generates an amplified output signal IND serving as input data representative of the received input signal RIN. The amplifier 106 may be implemented as an inverter, a buffer circuit, an operational amplifier, or any other suitable circuit configurations. The voltage source block 108 is configured and arranged to provide a voltage source labeled VDDI based on a reference voltage signal labeled VREF.

Figure 2:
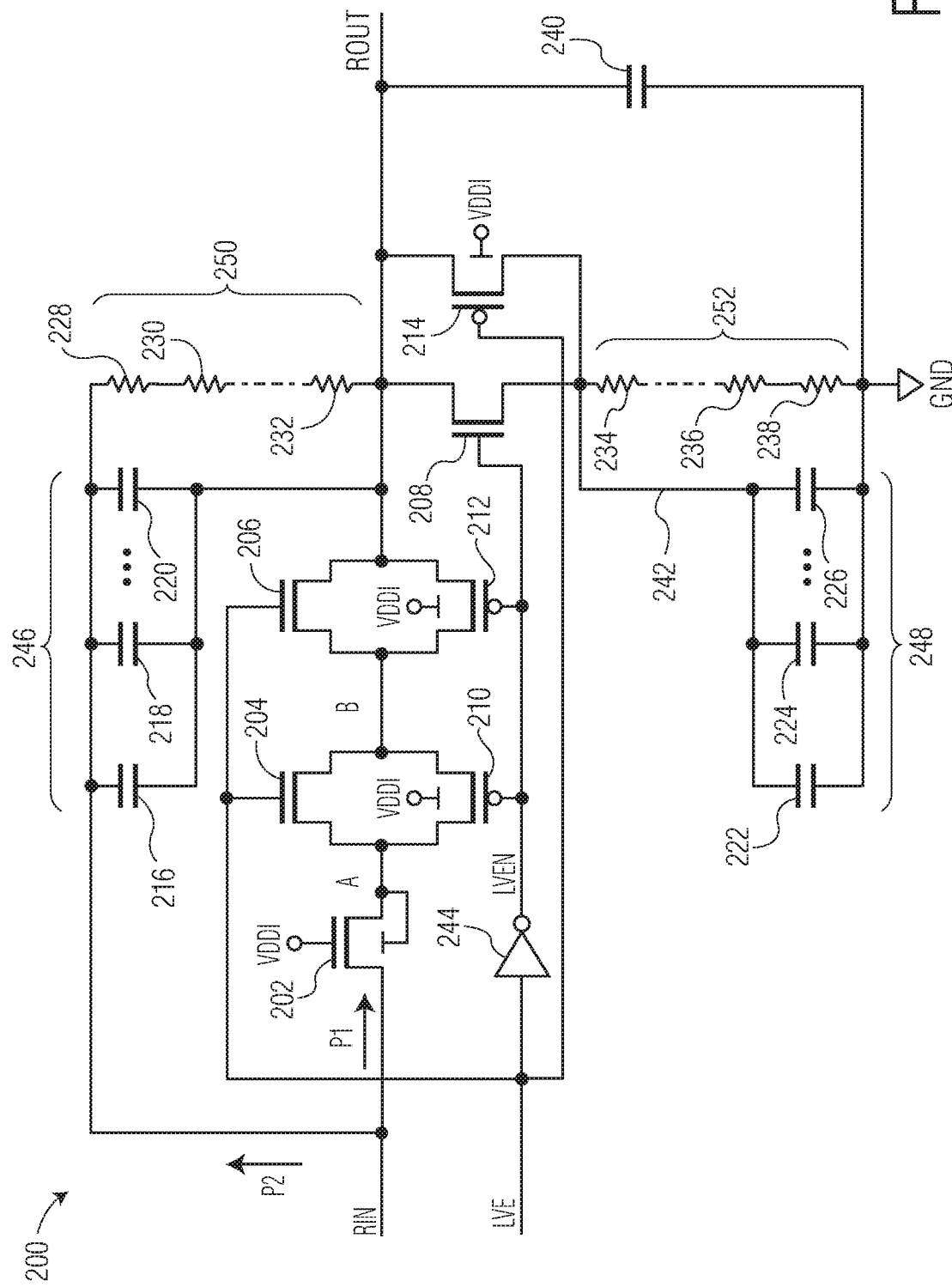
FIG. 2 illustrates, in simplified schematic diagram form, an example implementation of a receiver circuit in accordance with an embodiment.

FIG. 2 illustrates, in simplified schematic diagram form, an example receiver circuit 200 as an implementation of the receiver block 104 depicted in FIG. 1 in accordance with an embodiment. Receiver circuit 200 includes an input terminal RIN for receiving an input signal RIN and an output terminal ROUT for providing an output signal ROUT. In this embodiment, receiver 200 is implemented having a first signal path P1 and a second signal path P2 connected in parallel between the RIN terminal and the ROUT terminal. The receiver circuit 200 further includes an input labeled LVE for receiving a first control signal LVE. In this embodiment, the LVE control signal is configured for selecting one of the signal paths P1 and P2. For example, when the LVE control signal is at a first state (e.g., logic low), signal path P2 is selected in a first voltage mode for accommodating an input signal at the RIN terminal which has a voltage waveform exceeding the maximum operating voltage rating. When the LVE control signal is at a second state (e.g., logic high), signal path P1 is selected in a second voltage mode for accommodating an input signal at the RIN terminal which has a voltage waveform within the maximum operating voltage rating.

The first signal path P1 includes N-channel transistors 202-206 and P-channel transistors 210-212. A first current electrode of transistor 202 is coupled at the RIN terminal, a second current electrode of transistor 202 is coupled to a body electrode of transistor 202 at node A, and a control electrode of transistor 202 is coupled to a voltage source terminal labeled VDDI. Transistors 204 and 210 are coupled in parallel and configured as a first transfer gate. A first current electrode of transistor 204 and a first current electrode of transistor 210 are coupled to transistor 202 at node A. A control electrode of transistor 204 is coupled to a first control signal terminal to receive the LVE control signal. A control electrode of transistor 210 is coupled to a second control signal terminal labeled LVEN to receive a second control signal LVEN, where the LVEN control signal is a complementary signal of the LVE control signal. A body electrode of transistor 210 is coupled at the VDDI terminal. Transistors 206 and 212 are coupled in parallel and configured as a second transfer gate. A first current electrode of transistor 206 and a first current electrode of transistor 212 are coupled to second current electrodes of transistors 204 and 210 at node B. A control electrode of transistor 206 is coupled to the first control signal terminal to receive the LVE control signal and a control electrode of transistor 212 is coupled to the second control signal terminal to receive the LVEN control signal. Second current electrodes of transistors 206 and 212 are coupled at the ROUT terminal, and a body electrode of transistor 212 is coupled at the VDDI terminal.

In this embodiment, transistors 202-206 and 210-212 are formed in a process technology having a nominal operating voltage rating and a maximum operating voltage rating. The maximum operating voltage rating for transistors within a given process technology may be based on physical parameters such as gate oxide thickness, effective channel length, and the like. As an example, transistors 202-206 and 210-212 may be formed in a process technology having a nominal operating voltage of 1.8 volts and a maximum operating voltage rating (e.g., gate-source voltage rating) of 2.0 volts. A voltage (e.g., approximately 1.8 volts) within the maximum operating voltage rating (e.g., 2.0 volts) of the transistor 202 is provided at the gate electrode of transistor 202 by way of the VDDI source terminal. In this configuration of transistor 202, a voltage signal at the RIN terminal which exceeds the maximum operating voltage rating may be propagated through transistor 202 essentially being clamped at the voltage (VDDI) provided at the control terminal of transistor 202.

A first resistor-capacitor (RC) network is configured and arranged to form the second signal path P2 from the RIN terminal to the ROUT terminal. The first RC network includes a first capacitor network 246 coupled with a first resistor network 250. The first capacitor network includes a plurality of capacitors 216-220 connected in parallel for AC coupling an input signal at the RIN terminal. The first capacitor network 246 may include any suitable number of capacitors configured and arranged for AC coupling the input signal. First terminals of capacitors 216-220 are coupled at the RIN terminal and second terminals of capacitors 216-220 are coupled at the ROUT terminal. In this embodiment, each of the capacitors 216-220 are formed as metal fringe capacitors. In other embodiments, capacitors 216-220 may be formed as other suitable capacitor types which can be connected to bonding pad 102.

The first resistor network 250 includes a plurality of resistors 228-232 coupled in series for attenuating the input signal. The first resistor network 250 may include any suitable number of resistors configured and arranged for attenuating the input signal. A first terminal of resistor 228 is coupled at the RIN terminal and second terminal of resistor 228 is coupled to a first terminal of resistor 230. A second terminal of resistor 230 is coupled to a first terminal of resistor 232 and a second terminal of resistor 232 is coupled at the ROUT terminal.

The receiver circuit 200 further includes N-channel transistor 208 and P-channel transistor 214 configured for selectively connecting the second signal path P2 to a second RC network based on the LVE and LVEN signals. Transistors 208 and 214 are coupled in parallel and arranged as a third transfer gate. A first current electrode of transistor 208 and a first current electrode of transistor 214 are coupled at the ROUT terminal. A control electrode of transistor 208 is coupled to the second control signal terminal to receive the LVEN control signal and a control electrode of transistor 214 is coupled to the first control signal terminal to receive the LVE control signal. Second current electrodes of transistors 208 and 214 are coupled at node 242, and a body electrode of transistor 214 is coupled at the VDDI terminal. The second RC network is connected in series with the first RC network when the third transfer gate formed by transistors 208 and 214 is turned on or conducting (e.g., LVE control signal at a logic low). When the third transfer gate is turned off or not conducting (e.g., LVE control signal at a logic high), then the second RC network is isolated from the ROUT terminal.

The second RC network includes a second capacitor network 248 coupled with a second resistor network 252. The second capacitor network 248 includes a plurality of capacitors 222-226 connected in parallel. The second capacitor network 248, when connected to the ROUT terminal, forms a series connection with first capacitor network 246 to reduce (e.g., divide) a net capacitance at the ROUT terminal. The first capacitor network 248 may include any suitable number of capacitors configured and arranged for a desired capacitance value. First terminals of capacitors 222-226 are coupled at node 246 and second terminals of capacitors 216-220 are coupled at a voltage supply terminal labeled GND (e.g., ground). In this embodiment, each of the capacitors 222-226 are formed as metal fringe capacitors. In other embodiments, capacitors 222-226 may be formed as other suitable capacitor types.

The second resistor network 252 includes a plurality of resistors 234-238 coupled in series for attenuating the input signal. The second resistor network 252, when connected to the ROUT terminal, forms a voltage divider with first resistor network 250 to provide an attenuated input signal at the ROUT terminal. The second resistor network 252 may include any suitable number of resistors configured and arranged for a desired resistance value when attenuating the input signal. A first terminal of resistor 234 is coupled at node 242 and a second terminal of resistor 234 is coupled to a first terminal of resistor 236. A second terminal of resistor 236 is coupled to a first terminal of resistor 238 and a second terminal of resistor 238 is coupled at the GND supply terminal.

The receiver circuit 200 further includes an inverter 244 coupled to provide the LVEN control signal. An input terminal of inverter 244 is coupled to the LVE terminal and an output terminal of inverter 244 is coupled at the LVEN terminal. The receiver circuit 200 further includes a load (e.g., parasitic) capacitor 240 coupled at the ROUT terminal. A first terminal of capacitor 240 is coupled at the ROUT terminal and a second terminal of capacitor 240 is coupled at the GND supply terminal. Capacitor 240 is included for illustrative purposes being representative of parasitic capacitance coupled at the ROUT terminal.

In the embodiment depicted in FIG. 2, the LVE control signal is used for selecting one of the two signal paths P1 and P2. When the LVE control signal is at a logic low, signal path P2 is enabled for receiving the input signal at the RIN terminal. For example, the input signal received at the RIN terminal may be characterized as a radio frequency (RF) signal having a waveform with a voltage swing of 0 to 3.3 volts, exceeding the maximum operating voltage rating. Signal path P2 is enabled by forming an open circuit in signal path P1 by way of the first and the second transfer gates. When signal path P2 is enabled, the second RC network is connected to the first RC network by way of the third transfer gate. In this configuration, the effective resistance of the first resistor network 250 and the effective resistance of the second resistor network 252 are predetermined such that a desired attenuation of the input signal is provided at the ROUT terminal. For example, each of the first and second resistor networks 250-252 may be designed to have an effective resistance of about 50 kΩ thus providing an approximate 50% attenuation of the input signal provided at the ROUT terminal. The effective capacitance of the first capacitor network 246 and the effective capacitance of the second capacitor network 248 are predetermined such that a desired AC coupling to minimize distortion of the input signal is provided at the ROUT terminal. For example, the first capacitor network 246 may be designed to have an effective capacitance about equal to the effective capacitance of the second capacitor network 248 plus the effective parasitic capacitance (e.g., capacitor 240) coupled at the ROUT terminal to minimize capacitive effects on the signal provided at the ROUT terminal.

When the LVE control signal is at a logic high, signal path P1 is enabled for receiving the input signal at the RIN terminal. For example, the input signal received at the RIN terminal may be characterized as an RF signal having a waveform with a voltage swing of 0 to 1.8 volts, within the maximum operating voltage rating. Signal path P1 is enabled by forming a closed circuit in signal path P1 by way of the first and the second transfer gates. When signal path P1 is enabled, the second RC network is isolated from the ROUT terminal by way of the third transfer gate. In this configuration, the second RC network is decoupled from the first RC network allowing for lower voltage input signals to be provided at the ROUT terminal at higher speeds, without attenuation, and having minimal distortion.

Figure 3:
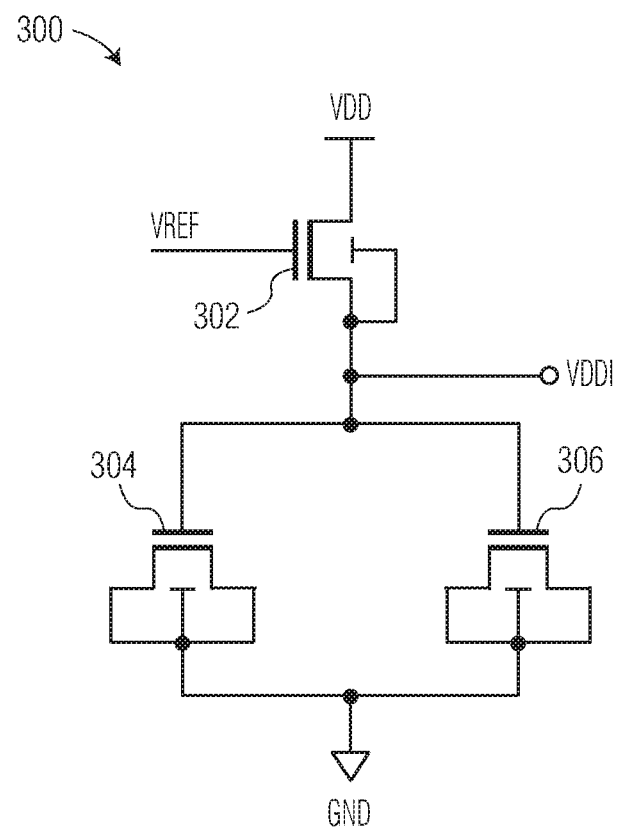
FIG. 3 illustrates, in simplified schematic diagram form, an example implementation of a voltage source in accordance with an embodiment.

FIG. 3 illustrates, in simplified schematic diagram form, an example voltage source 300 as an implementation of the voltage source block 108 depicted in FIG. 1 in accordance with an embodiment. The voltage source includes an input terminal labeled VREF for receiving a reference voltage VREF and an output voltage source terminal labeled VDDI for providing the VDDI voltage. In this embodiment, the voltage source 300 further includes an N-channel transistor 302 and capacitors 304-306. A first current electrode of transistor 302 is coupled to a voltage supply terminal labeled VDD at which a voltage VDD is supplied and a control electrode of transistor 302 is coupled to the VREF terminal for receiving the reference voltage VREF. A second current electrode of transistor 302 is coupled to a body electrode of transistor 302, first terminals of capacitors 304-306, and the VDDI terminal. Second terminals of capacitors 304-306 are coupled to the GND supply terminal. In this embodiment, capacitors 304-306 are formed from N-channel transistor structures having body electrodes coupled to source/drain electrodes forming the second terminals. In other embodiments, capacitors 304-306 may be formed from other suitable capacitor structures. In this embodiment, the VDDI voltage provided at the VDDI terminal is based on the VREF voltage provided at the control electrode of transistor 302. For example, with a VDD voltage of 3.3. volts, a predetermined VREF voltage is provided at the control electrode of transistor 302 to provide a desired VDDI voltage of approximately 1.8 volts.

Generally, there is provided, a circuit including a first signal path coupled between an input terminal and an output terminal; a second signal path coupled between the input terminal and the output terminal, the second signal path parallel with the first signal path; a first transistor in the first signal path having a control electrode coupled to a voltage source terminal and a first current electrode coupled at the input terminal, the first transistor configured and arranged for receiving a first signal at the first input terminal having a voltage exceeding a voltage rating of the first transistor; a second transistor in the first signal path having a first current electrode coupled to a second current electrode of the first transistor and a control electrode coupled to receive a first control signal, the second transistor configured to form an open circuit in the first signal path when the first control signal is at a first state; and a first resistor network in the second signal path configured and arranged for attenuating the first signal, the first resistor network having a first terminal coupled at the input terminal and a second terminal coupled at the output terminal. The circuit may further include a third transistor having a first current electrode coupled to a second current electrode of the second transistor, a second current electrode coupled at the output terminal, and a control electrode coupled to receive the first control signal, the third transistor configured to form an open circuit in the first signal path when the first control signal is at the first state. The circuit may further include a third transistor having a first current electrode coupled at the output terminal and a control electrode coupled to receive a second control signal, the second control signal a complementary signal of the first control signal; and a second resistor network configured and arranged to form a voltage divider with the first resistor network when the first control signal is at the first state, the second resistor network having a first terminal coupled to a second current electrode of the third transistor and a second terminal coupled a ground supply terminal. The circuit may further include a first capacitor network coupled in parallel with the first resistor network; and a second capacitor network coupled in parallel with the first resistor network. The first capacitor network and the second capacitor network may each include a plurality of capacitors connected in parallel, the capacitors of each plurality characterized as metal fringe capacitors. The first capacitor network may be configured to have an effective capacitance approximately equal to an effective capacitance of the second capacitor network and parasitic capacitance coupled at the output terminal. Each of the first resistor network and the second resistor network may include a plurality of resistors connected in series. Each of the second transistor and the third transistor may have a similar voltage rating as the first transistor. The control signal may be configured to be at a second state for receiving a second signal at the first input terminal, the second signal within the voltage rating of the first transistor, the third transistor configured to form an open circuit isolating the second resistor network from the output terminal when the control signal is at the second state.

In another embodiment, there is provided, a circuit including a first signal path coupled between an input terminal and an output terminal, the first signal path including a first transistor having a control electrode coupled to a voltage source terminal and a first current electrode coupled at the input terminal, the first transistor configured and arranged for receiving a first signal at the first input terminal having a voltage exceeding a voltage rating of the first transistor; and a second transistor having a first current electrode coupled to a second current electrode of the first transistor and a control electrode coupled to receive a first control signal, the second transistor configured to form an open circuit in the first signal path when the first control signal is at a first state; and a first resistor-capacitor (RC) network coupled to form a second signal path between the input terminal and the output terminal, the first RC network configured and arranged for attenuating the first signal. The circuit may further include a third transistor having a first current electrode coupled at the output terminal and a control electrode coupled to receive a second control signal, the second control signal a complementary signal of the first control signal; and a second RC network having a first terminal coupled to a second current electrode of the third transistor and a second terminal coupled to a ground supply terminal, the third transistor configured and arranged to isolate the second RC network from the output terminal when the first control signal is at a second state. The first RC network, the second RC network, and the third transistor may be configured to have an effective resistance of 50 kΩ or greater from the input terminal to the ground supply terminal when the first control signal is at the first state. The first RC network may be configured to have an effective capacitance approximately equal to an effective capacitance of the second RC network and parasitic capacitance coupled at the output terminal. The control signal may be configured to be at the second state for receiving a second signal at the first input terminal, the second signal within the voltage rating of the first transistor. The circuit may further include a third transistor having a first current electrode coupled to a second current electrode of the second transistor, a second current electrode coupled at the output terminal, and a control electrode coupled to receive the first control signal, the third transistor configured to form an open circuit in the first signal path when the first control signal is at the first state. The first RC network may include a first capacitor network coupled in parallel with a first resistor network, the first capacitor network comprising a plurality of capacitors connected in parallel, each of the capacitors of the plurality characterized as metal fringe capacitors. The input terminal may be coupled to a pad to in parallel with a first resistor network, the first capacitor network comprising a plurality of capacitors connected in parallel, each of the capacitors of the plurality characterized as metal fringe capacitors.

In yet another embodiment, there is provided, a circuit including a first signal path coupled between an input terminal and an output terminal, the first signal path including a first transistor having a control electrode coupled to a voltage source terminal and a first current electrode coupled at the input terminal, the first transistor having a maximum operating voltage rating; and a second transistor having a first current electrode coupled to a second current electrode of the first transistor and a control electrode coupled to receive a first control signal, the second transistor configured to form an open circuit in the first signal path when the first control signal is at a first state; and a first resistor-capacitor (RC) network coupled to form a second signal path between the input terminal and the output terminal, the first RC network configured and arranged for attenuating the first signal; wherein the first control signal is configured to be at the first state to receive a first signal at the input terminal exceeding the maximum operating voltage rating and at a second state to receive a second signal at the first input terminal within the maximum operating voltage rating. The circuit may further include a third transistor having a first current electrode coupled at the output terminal and a control electrode coupled to receive a second control signal, the second control signal a complementary signal of the first control signal; and a second RC network having a first terminal coupled to a second current electrode of the third transistor and a second terminal coupled to a ground supply terminal, the third transistor configured and arranged to isolate the second RC network from the output terminal when the first control signal is at the second state. The first signal and the second signal may be characterized characterized as radio frequency (RF) signals, the first signal attenuated to be within the maximum operating voltage rating at the output terminal.

By now it should be appreciated that there has been provided, an I/O receiver with high voltage tolerance and low signal distortion. The receiver includes a configurable signal path having a first signal path for receiving a low voltage input signal and a second path for receiving a high voltage input signal. The second signal path provides for low leakage currents with a resistor-based attenuator and an AC-coupled path portion for minimizing signal distortion. The receiver circuitry is implemented in a low-voltage process technology for accommodating both low voltage and high voltage signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit comprising:
   a first signal path coupled between an input terminal and an output terminal;
   a second signal path coupled between the input terminal and the output terminal, the second signal path parallel with the first signal path;
   a first transistor in the first signal path having a control electrode coupled to a voltage source terminal and a first current electrode coupled at the input terminal, the first transistor configured and arranged for receiving a first signal at the first input terminal having a voltage exceeding a voltage rating of the first transistor;
   a second transistor in the first signal path having a first current electrode coupled to a second current electrode of the first transistor and a control electrode coupled to receive a first control signal, the second transistor configured to form an open circuit in the first signal path when the first control signal is at a first state; and
   a first resistor network in the second signal path configured and arranged for attenuating the first signal, the first resistor network having a first terminal coupled at the input terminal and a second terminal coupled at the output terminal.

2. The circuit of claim 1, further comprising a third transistor having a first current electrode coupled to a second current electrode of the second transistor, a second current electrode coupled at the output terminal, and a control electrode coupled to receive the first control signal, the third transistor configured to form an open circuit in the first signal path when the first control signal is at the first state.

3. The circuit of claim 1, further comprising:
a third transistor having a first current electrode coupled at the output terminal and a control electrode coupled to receive a second control signal, the second control signal a complementary signal of the first control signal; and
a second resistor network configured and arranged to form a voltage divider with the first resistor network when the first control signal is at the first state, the second resistor network having a first terminal coupled to a second current electrode of the third transistor and a second terminal coupled a ground supply terminal.

4. The circuit of claim 3, further comprising:
a first capacitor network coupled in parallel with the first resistor network; and
a second capacitor network coupled in parallel with the first resistor network.

5. The circuit of claim 4, wherein the first capacitor network and the second capacitor network each comprise a plurality of capacitors connected in parallel, the capacitors of each plurality characterized as metal fringe capacitors.

6. The circuit of claim 4, wherein the first capacitor network is configured to have an effective capacitance approximately equal to an effective capacitance of the second capacitor network and parasitic capacitance coupled at the output terminal.

7. The circuit of claim 3, wherein each of the first resistor network and the second resistor network comprises a plurality of resistors connected in series.

8. The circuit of claim 3, wherein each of the second transistor and the third transistor has a similar voltage rating as the first transistor.

9. The circuit of claim 3, wherein the control signal is configured to be at a second state for receiving a second signal at the first input terminal, the second signal within the voltage rating of the first transistor, the third transistor configured to form an open circuit isolating the second resistor network from the output terminal when the control signal is at the second state.

10. A circuit comprising:
a first signal path coupled between an input terminal and an output terminal, the first signal path comprising:
a first transistor having a control electrode coupled to a voltage source terminal and a first current electrode coupled at the input terminal, the first transistor configured and arranged for receiving a first signal at the first input terminal having a voltage exceeding a voltage rating of the first transistor; and
a second transistor having a first current electrode coupled to a second current electrode of the first transistor and a control electrode coupled to receive a first control signal, the second transistor configured to form an open circuit in the first signal path when the first control signal is at a first state; and
a first resistor-capacitor (RC) network coupled to form a second signal path between the input terminal and the output terminal, the first RC network configured and arranged for attenuating the first signal.

11. The circuit of claim 10, further comprising:
a third transistor having a first current electrode coupled at the output terminal and a control electrode coupled to receive a second control signal, the second control signal a complementary signal of the first control signal; and
a second RC network having a first terminal coupled to a second current electrode of the third transistor and a second terminal coupled to a ground supply terminal, the third transistor configured and arranged to isolate the second RC network from the output terminal when the first control signal is at a second state.

12. The circuit of claim 11, wherein the first RC network, the second RC network, and the third transistor are configured to have an effective resistance of 50 kΩ or greater from the input terminal to the ground supply terminal when the first control signal is at the first state.

13. The circuit of claim 11, wherein the first RC network is configured to have an effective capacitance approximately equal to an effective capacitance of the second RC network and parasitic capacitance coupled at the output terminal.

14. The circuit of claim 11, wherein the control signal is configured to be at the second state for receiving a second signal at the first input terminal, the second signal within the voltage rating of the first transistor.

15. The circuit of claim 10, further comprising a third transistor having a first current electrode coupled to a second current electrode of the second transistor, a second current electrode coupled at the output terminal, and a control electrode coupled to receive the first control signal, the third transistor configured to form an open circuit in the first signal path when the first control signal is at the first state.

16. The circuit of claim 10, wherein the first RC network comprises a first capacitor network coupled in parallel with a first resistor network, the first capacitor network comprising a plurality of capacitors connected in parallel, each of the capacitors of the plurality characterized as metal fringe capacitors.

17. The circuit of claim 10, wherein the input terminal is coupled to a pad to in parallel with a first resistor network, the first capacitor network comprising a plurality of capacitors connected in parallel, each of the capacitors of the plurality characterized as metal fringe capacitors.

18. A circuit comprising:
a first signal path coupled between an input terminal and an output terminal, the first signal path comprising:
a first transistor having a control electrode coupled to a voltage source terminal and a first current electrode coupled at the input terminal, the first transistor having a maximum operating voltage rating; and
a second transistor having a first current electrode coupled to a second current electrode of the first transistor and a control electrode coupled to receive a first control signal, the second transistor configured to form an open circuit in the first signal path when the first control signal is at a first state; and
a first resistor-capacitor (RC) network coupled to form a second signal path between the input terminal and the output terminal, the first RC network configured and arranged for attenuating the first signal;
wherein the first control signal is configured to be at the first state to receive a first signal at the input terminal exceeding the maximum operating voltage rating and at a second state to receive a second signal at the first input terminal within the maximum operating voltage rating.

19. The circuit of claim 18, further comprising:
a third transistor having a first current electrode coupled at the output terminal and a control electrode coupled to receive a second control signal, the second control signal a complementary signal of the first control signal; and a second RC network having a first terminal coupled to a second current electrode of the third transistor and a second terminal coupled to a ground supply terminal, the third transistor configured and arranged to isolate the second RC network from the output terminal when the first control signal is at the second state.

20. The circuit of claim 18, wherein the first signal and the second signal are characterized as radio frequency (RF) signals, the first signal attenuated to be within the maximum operating voltage rating at the output terminal.

\* \* \* \* \*